(12) United States Patent
Mueller et al.

(10) Patent No.: US 6,188,598 B1
(45) Date of Patent: Feb. 13, 2001

(54) REDUCING IMPACT OF COUPLING NOISE

(75) Inventors: Gerhard Mueller; Ulrike Gruening, both of Wappingers Falls, NY (US)

(73) Assignee: Infineon Technologies North America Corp., San Jose, CA (US)

( * ) Notice: Under 35 U.S.C. 154(b), the term of this patent shall be extended for 0 days.

(21) Appl. No.: 09/406,891

(22) Filed: Sep. 28, 1999

(51) Int. Cl.[7] .................................................. G11C 5/06
(52) U.S. Cl. .............................. 365/69; 365/63; 365/206; 365/214
(58) Field of Search .................................. 365/51, 63, 69, 365/206, 214

(56) References Cited

U.S. PATENT DOCUMENTS

| | | | |
|---|---|---|---|
| 4,980,860 | * 12/1990 | Houston et al. | 365/189.11 |
| 5,214,601 | * 5/1993 | Hidaka et al. | 365/63 |
| 5,475,643 | * 12/1995 | Ohta | 365/206 |
| 5,602,773 | * 2/1997 | Campbell | 365/69 |
| 5,864,181 | * 1/1999 | Keeth | 257/776 |
| 6,034,879 | * 3/2000 | Min et al. | 365/63 |

* cited by examiner

*Primary Examiner*—Son Mai
(74) *Attorney, Agent, or Firm*—Stanton Braden

(57) ABSTRACT

An integrated circuit comprising a first bitline pair 310 on a first bitline level which is adjacent to a second bitline pair 320 on a second bitline level is provided. The first bitline pair comprises m twists 340, where m is a whole number $\geq 1$ and the second bitline pair comprises n twists 350 and 351, where n is a whole number $\neq m$. The twists transform coupling noise from adjacent bitline pairs into common mode noise, which results in improved signal margin.

26 Claims, 5 Drawing Sheets

REDUCING IMPACT OF COUPLING NOISE

FIELD OF THE INVENTION

The present invention relates generally to reducing the adverse impact of noise coupling in signal lines of, for example, an integrated circuit (IC). In particular, the invention relates to bitline architectures which reduce the impact of noise to improve sensing of memory cells.

BACKGROUND OF THE INVENTION

Referring to FIG. 1, a conventional dynamic random access memory cell 101 is shown. The memory cell comprises a cell transistor 110 and a cell capacitor 150 for storing information. A first junction 111 of the transistor is coupled to a bitline 125, and a second junction 112 is coupled to the capacitor. A gate electrode 113 of the transistor is coupled to a wordline 126. A reference or constant voltage ($V_{pl}$) can be coupled to a plate of the capacitor. The plate which is coupled to the reference voltage can serve as a common plate in the memory array.

A plurality of cells are arranged in rows and columns, connected by wordlines in the row direction and bitlines in the column direction. The bitlines can be arranged in various types of bitline architectures, such as open, folded, open-folded, diagonal, multi-level, split-level, or split-level diagonal. Multi-level or split-level bitline architectures are described in, for example, Hamada et al., A Split Level Diagonal Bitline Stack Capacitor Cell for 256 Mb DRAMs, IEDM 92-7990, which is herein incorporated by reference for all purposes.

The bitlines are coupled to sense amplifiers to facilitate memory accesses. Typically, a pair of bitlines is coupled to a sense amplifier. The bitline containing the selected memory cell is referred to as the bitline or bitline true and the other is referred to as the reference bitline or bitline complement.

A memory access typically comprises precharging the bitlines to a predefined voltage (e.g., equalization voltage or $V_{bleq}$). A memory cell within a bitline pair is selected after the bitlines are precharged and floated. The memory cell is selected by rendering the transistor of the memory cell conductive, coupling the memory cell's capacitor to the bitline true. Depending on the value stored in the capacitor, the bitline true is pulled above or below $V_{bleq}$. The reference bitline, in the ideal case, remains at $V_{bleq}$. The voltage difference between the reference bitline and bitline true is the differential voltage. A sense amplifier coupled to the bitline pair senses and amplifies the differential voltage, which is indicative of the data stored in the selected memory cell.

An important issue to consider in designing memory ICs is to provide an adequate sensing signal (i.e., differential voltage) to the sense amplifier in order for the data to be read accurately from memory. The differential signal sensed by a sense amplifier, in an ideal situation, depends on the charge sharing between the bitline and the memory cell. The ratio of the bitline capacitance (and the capacitance of the sense amplifier) to the cell capacitance determines the magnitude of the differential signal. However, the voltage on the reference bitline increases or decreases along with the voltage swing on the bitline true due to noise coupling between the bitlines (intra-bitline coupling). This results in a decrease in the magnitude of the differential signal, which is undesirable as this may lead to incorrect evaluation of the data stored in the memory cell.

Noise coupling from neighboring bitline pairs (inter-bitline coupling) can also reduce the signal margin. This sense amplifiers of the array may not be activated simultaneously. This occurs as a result of, for example, different amplification speeds for a "0" and a "1", difference in the threshold voltage of the various latch transistors, or a skew in the activation of the sense amplifiers in the top and bottom bank in an interleaved arrangement. Coupling noise from a bitline pair whose differential signal is amplified can reduce the differential signal of a neighboring bitline pair whose differential signal has yet to be amplified.

The problems associated with bitline coupling noise become worse as technology migrates to smaller groundrules due to the fact that the fraction bitline-to-bitline capacitance contribution to the total bitline capacitance increases with smaller dimensions.

As evidenced from the foregoing discussion, it is desirable to reduce the impact of coupling noise to avoid degrading or reducing the signal margin of a differential signal.

SUMMARY OF THE INVENTION

The invention relates to reducing the adverse impacts of coupling noise from neighboring signal lines in integrated circuits with multiple signal line levels. In one embodiment, a memory IC comprises a first bitline pair with first and second bitlines on a first bitline level and a second bitline pair with first and second bitline on a second bitline level. The first bitline pair is adjacent to the second bitline pair. The first bitline pair comprises m twists, where m is a whole number $\geq 1$. The second bitline pair comprises n twists, where n is a whole number not equal to m. The twists switch the bitline paths of the bitlines within the bitline pair. The twists are located along the bitline pairs to transform coupling noise between the bitline pairs into common mode noise, which does not adversely impact signal margin.

DETAILED DESCRIPTION OF THE INVENTION

The invention relates to reducing the adverse impact of coupling noise in signal lines. In one embodiment, the invention reduces the impact of coupling noise in bitlines of ICs such as, for example, random access memories (RAMs) including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs.

Figure 1:
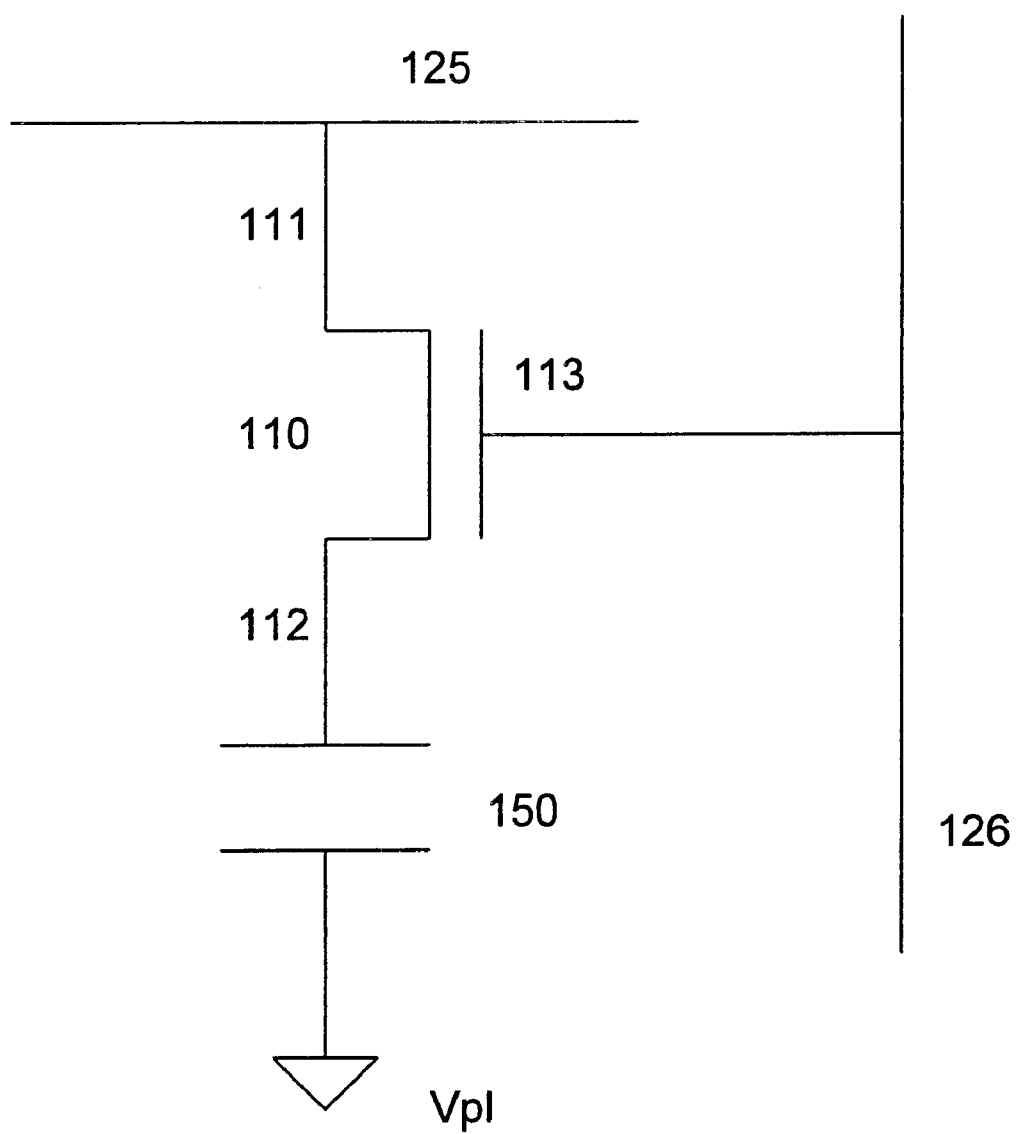
FIG. 1 shows a memory cell.
Figure 2:
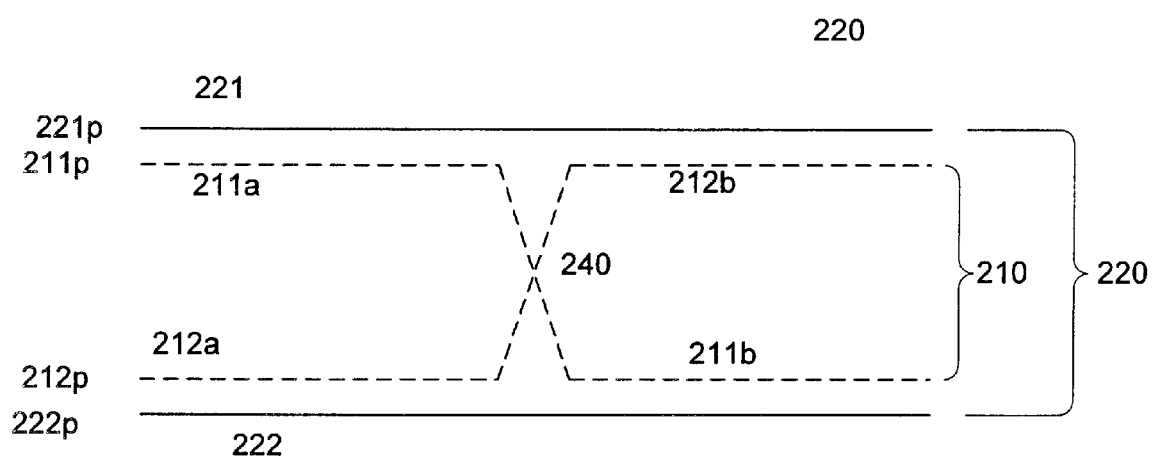
FIG. 2–4 show embodiments of the invention for reducing the impact of bitline coupling noise.

FIG. 2 shows a plan view of a portion of an IC with signal line pairs on first and second signal line levels for reducing the impact of coupling noise in accordance with one embodiment of the invention. The signal lines, for example, can be differential signal lines, internal differential data lines, differential clock lines, or other types of differential signal lines.

In one embodiment, the signal lines comprise bitline pairs of a multi-level or split-level bitline architecture. A first bitline pair 210 (dotted lines) and a second bitline pair 220 (solid lines) are provided in first and second bitline planes or levels. A bitline pair comprises first and second bitlines (211 and 212 or 221 and 222). One bitline within the pair is referred to as the bitline or bitline true while the other is referred to as a reference bitline or bitline complement. The bitlines are located along bitline paths (identified by the letter p after a reference number). The different bitline levels can be realized in metal 0 (M0) and metal 1 (M1) of an IC.

The first bitline pair on the first bitline level is adjacent to the second bitline pair on the second level. The bitline paths of one bitline pair can be substantially aligned with the bitline paths of the other bitline pair. Offsetting the bitline paths of the different bitline pairs can also be useful, for example, to facilitate the coupling of memory cells to bitlines on the upper bitline level.

To reduce the impact of coupling noise between the bitline pairs, one bitline pair (either the first or the second bitline pair) comprises a twist. In one embodiment, the first bitline pair 210 comprises a twist 240. The twist divides bitline 211 and 212 into segments 211*a–b* and 212*a–b*. The twist switches the positions of the bitlines within the bitline pair (i.e., the segments of a bitline on different sides of the twist are located in different bitline paths of the bitline pair). Bitline segment 211*a* on the left side of the twist is in bitline path 211*p* while segment 211*b* on the right side of the twist is in bitline path 212*p*. Likewise bitline segments 212*a* and 212*b* are in different bitline paths.

In one embodiment, the first bitline pair comprises one twist which is located at about the middle of the bitlines, dividing the bitlines in two segments that are about equal in length (about ½ the length of the bitline). The total lengths of the bitline true and bitline complement segments on the same bitline path are about equal. By having such a configuration, the noise components from the bitlines of one bitline pair impact the bitlines of an adjacent bitline pair in the same manner, creating common mode noise which does not adversely impact the signal margin.

In another embodiment, the first bitline pair comprises m twists, where m is a whole number $\geq 1$; the second bitline pair comprises n twists, where n is a whole number $\neq$ m. The twists are employed to switch the bitline paths of the bitlines within the bitline pair. The twists separate the bitlines into a plurality of bitline segments (m+1 or n+1 if n>0). The first and second bitline pairs comprise a different number of segments since each contains a different number of twists.

The total lengths of the first and second bitline segments in a bitline path are about equal. The twist or twists are located along the bitlines such that the bitlines from one bitline pair and the bitlines from the other bitline pair along adjacent bitline paths impact each other in the same manner, causing coupling noise to be common mode noise.

Figure 3:
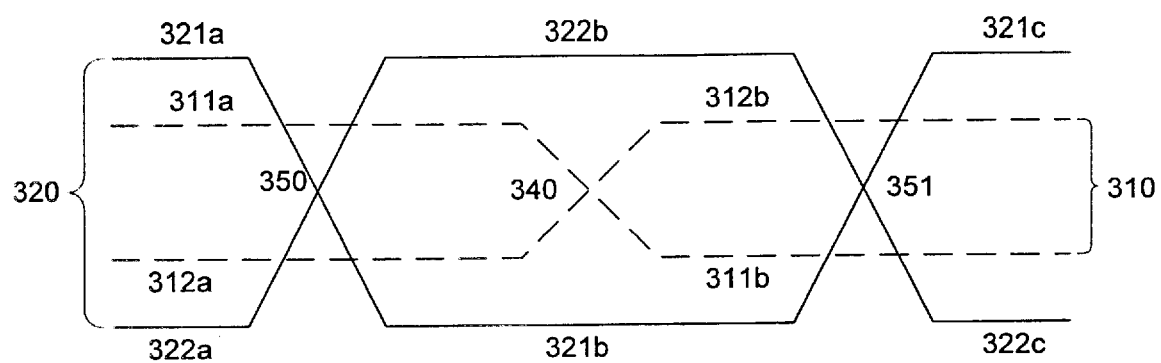

FIG. 3 shows another embodiment of the invention. As shown, twists are provided in bitline pairs in upper and lower bitline levels to cause noise coupling from the bitline pairs to be common mode noise. In one embodiment, a first bitline pair 310 (dotted lines) in a first metal level comprises a twist 340; a second bitline pair 320 (solid lines) on a second metal level comprises twists 350 and 351.

The twist 340 separates bitline 311 into segments 311*a–b* and reference bitline 312 into segments 312*a–b*. The segments are substantially equal to about ½ the length of the bitlines. Twists 350 and 351 separate bitline 321 into segments 321*a–c* and reference bitline 322 into segments 322*a–c*. Segments 321*a*, 321*c*, 322*a*, and 322*c* are substantially equal to about ¼ the length of the bitlines while segments 321*b* and 322*b* are substantially equal to about ½ the length of the bitlines. The twists alternate the positions of the bitline segments within the bitline pair. The total lengths of the first and second bitline segments along a bitline path are about equal. The twists are placed along the bitline pairs such that the coupling noise between the bitline pairs is transformed into common mode noise.

Figure 4:
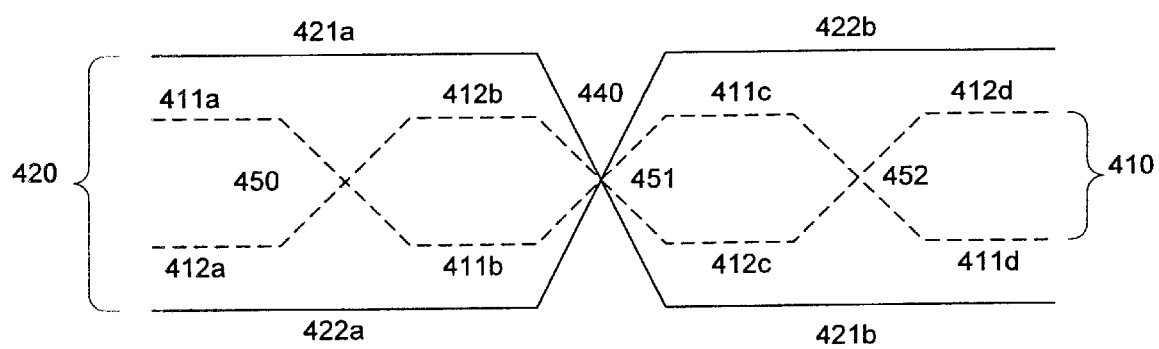

FIG. 4 shows yet another embodiment of the invention. As shown, a first bitline pair 410 (dotted lines) on a first bitline level comprises twists 450, 451, and 452. A second bitline pair 420 (solid lines) on a second bitline level comprises a twist 440. Twists 450, 451, and 452 separate bitlines 411 and 412 of the first bitline pair into segments 411*a–d* and 412*a–d*; twist 440 separates bitlines 421 and 422 of the second bitline pair into segments 421*a–b* and 422*a–b*. Segments 421*a–b* and 422*a–b* are substantially equal to about ½ the length of the bitlines and segments 411 *a–d* and 412*a–d* are substantially equal to about ¼ the length of the bitlines. The twists alternate the positions of the bitline segments within the bitline pair, which results in the total lengths of the first and second bitline segments along a bitline path to be about equal. By appropriately locating the twists along the bitline pairs, coupling noise is transformed into common mode noise.

In a split-level or multi-level bitline architecture, the array comprises a plurality of bitline pairs in different bitline levels. Coupling noise from adjacent bitline pairs in the same and other bitline levels can reduce signal margin. To reduce the adverse impact of coupling noise with adjacent bitline pairs from the same and different bitline levels, twists are provided in bitline pairs in the different bitline levels.

Figure 5:
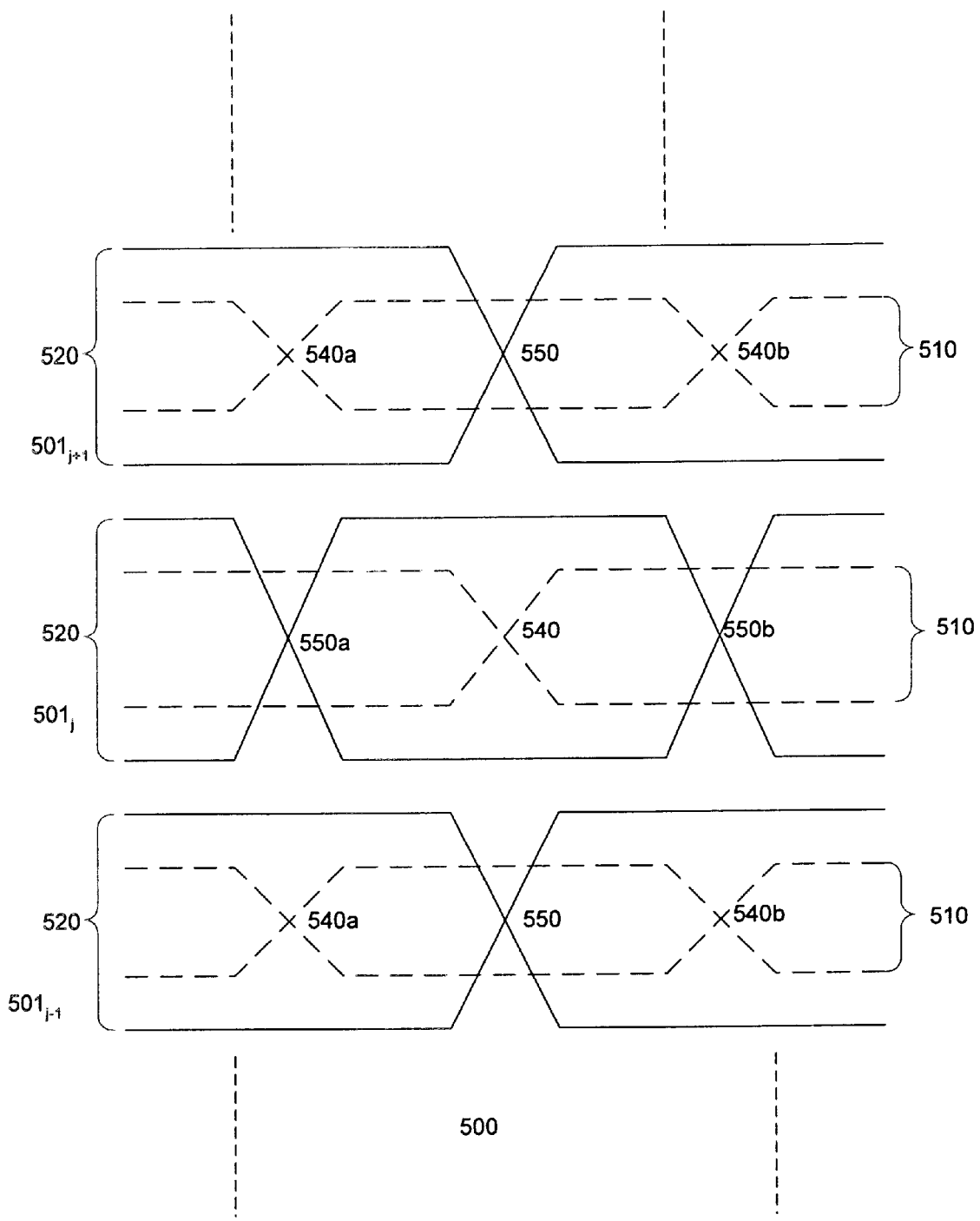
FIG. 5 shows another embodiment of the invention for reducing the impact of bitline coupling noise.

FIG. 5 shows an array 500 in accordance with one embodiment of the invention. The array comprises building blocks 501 having bitline pairs on different bitline levels. As shown, a building block comprises a first bitline pair 510 on a first bitline level (depicted by dotted lines) which is adjacent to a second bitline pair 520 on a second bitline level (depicted by solid lines).

To reduce the impact of coupling noise between adjacent bitline pairs on the different bitline levels (inter-level bitline noise coupling), twists are provided in the bitline pairs. For example, in building block 501$_j$, the first bitline pair comprises $m_j$ twists 540, where $m_j$ is a whole number $\geq 1$. The second bitline pair comprises $n_j$ twists, where $n_j$ is a whole number not equal to $m_j$. In one embodiment, the first bitline pair is provided with one twist 540 ($m_j$=1) while the second bitline pair has two twists 550*a–b* ($n_j$=2). The twists transform coupling noise between bitline pairs 510 and 520 into common mode noise.

Adjacent building blocks 501$_{j\pm1}$ comprise bitline pairs on first and second bitline levels. The adjacent building blocks similarly comprise at least one twist in one of the bitline pairs while the other bitline pair can be provided with any number (including 0) of twists that is not equal to the number of twists in the one bitline pair. The twist or twists are provided on the bitline pairs to reduce coupling noise problems between bitline pairs within the building block.

In a preferred embodiment, twists are provided in the bitline pairs of the array to reduce the impact of coupling noise with adjacent bitline pairs on different bitline levels as well as on the same bitline level (i.e., noise coupling between bitline pairs within a building block as well as with bitline pairs in neighboring or adjacent building blocks). In one embodiment, a first bitline pair 510 within a building block 501$_j$ comprises $m_j$ twists, where $m_j$ is a whole number $\geq 1$. The second bitline pair within the building block 501$_j$ comprises $n_j$ twists, where $n_j$ is a whole number not equal to $m_j$. Illustratively, $m_j$=1 (twist 540) and $n_j$=2 (twists 550*a–b*).

In adjacent building blocks 501$_{j\pm1}$, the constraints of m (whole number $\geq 1$) and n (whole number $\neq$ m) are assigned to the other bitline pair. That is, in adjacent building blocks, the first bitline pair comprises n twists while the second bitline pair comprises m twists. In one embodiment, the first bitline pair comprises twists 540*a–b* ($n_{j\pm1}=2$), and the second bitline pair comprises a twist 550 ($m_{j\pm1}=1$). The values of m and n need not be the same in all the building blocks of the array, as long as adjacent bitline pairs (same or different bitline level) do not contain the same number of twists. For example, $m_{j+1}$ does not have to be equal to $m_{j-1}$; $n_{j+1}$ does not have to be equal to $n_{j-1}$. By providing such a configuration, degradation of the sensing signal due to coupling noise is reduced or avoided.

As described, the building blocks are similar to the building block of FIG. 3 except that in alternating building blocks, the twist configuration in the first and second bitline pairs is switched. The use of building blocks such as those described in FIG. 2, FIG. 4, or other configurations are also useful. Also, every other n or every other m need not be the same. The building blocks can also be interleaved together. Interleaving the building blocks causes the bitline paths of a bitline pair to be adjacent to bitline paths of another bitline pair.

While the invention has been particularly shown and described with reference to various embodiments, it will be recognized by those skilled in the art that modifications and changes may be made to the present invention without departing from the spirit and scope thereof. Merely by way of example, the invention can be useful for reducing the impact of coupling noise in any type of differential signal lines. The scope of the invention should therefore be determined not with reference to the above description but with reference to the appended claims along with their full scope of equivalents.

What is claimed is:

1. An integrated circuit comprising:
   a first signal line pair having first and second signal lines, the first signal line pair includes m number of twists, wherein a twist switches signal line paths of the first and second signal lines;
   a second signal line pair having first and second signal lines;
   a first conductive level on which the first signal line pair is located; and
   a second conductive level on which the second signal line pair is located, the first signal line pair electrically isolated from the second signal line pair and wherein the m twists reduces impact of coupling noise between the signal line pairs.

2. The integrated circuit of claim 1 wherein the signal line paths of the first and second signal lines comprise signal line paths of the first signal line pair.

3. The integrated circuit of claim 2 wherein the first and second signal line pairs comprise bitline pairs.

4. The integrated circuit of claim 2 where m=1.

5. The integrated circuit of claim 4 wherein the first and second signal line pairs comprise bitline pairs.

6. The integrated circuit of claim 1 where m=1.

7. The integrated circuit of claim 6 wherein the signal line paths of the first and second signal lines comprise signal line paths of the first signal line pair.

8. The integrated circuit of claim 7 wherein the first and second signal line pairs comprise bitline pairs.

9. The integrated circuit of claim 6 wherein the first and second signal line pairs comprise bitline pairs.

10. The integrated circuit of claim 1 wherein the first and second signal line pairs comprise bitline pairs.

11. The integrated circuit of claim 1, 2, 3, 4, 5, 6, 7, 8, 9, or 10 wherein the second signal pair comprises n twists, where n is a whole number not equal to m.

12. The integrated circuit of claim 11 wherein n is equal to 2 or 3.

13. The integrated circuit of claim 6 wherein the signal line paths of the first and second signal lines of the second signal line pairs comprise signal line paths of the second signal line pair.

14. The integrated circuit of claim 13 further comprises a plurality of memory cells coupled to the bitlines.

15. The integrated circuit of claim 12 further comprises a plurality of memory cells coupled to the bitlines.

16. The integrated circuit of claim 15 wherein the signal line paths of the first and second signal lines of the second signal line pairs comprise signal line paths of the second signal line pair.

17. The integrated circuit of claim 11 further comprises a plurality of memory cells coupled to the bitlines.

18. The integrated circuit of claim 17 wherein n is equal to 2 or 3.

19. The integrated circuit of claim 18 wherein the signal line paths of the first and second signal lines of the second signal line pairs comprise signal line paths of the second signal line pair.

20. The integrated circuit of claim 17 wherein the signal line paths of the first and second signal lines of the second signal line pairs comprise signal line paths of the second signal line pair.

21. The integrated circuit of claim 20 wherein n is equal to 2 or 3.

22. The integrated circuit of claim 11 wherein the signal line paths of the first and second signal lines of the second signal line pairs comprise signal line paths of the second signal line pair.

23. The integrated circuit of claim 22 wherein n is equal to 2 or 3.

24. The integrated circuit of claim 23 further comprises a plurality of memory cells coupled to the bitlines.

25. The integrated circuit of claim 22 further comprises a plurality of memory cells coupled to the bitlines.

26. The integrated circuit of claim 25 wherein n is equal to 2 or 3.

* * * * *